(12) United States Patent
Kim et al.

(10) Patent No.: US 11,373,980 B2
(45) Date of Patent: Jun. 28, 2022

(54) SEMICONDUCTOR PACKAGE

(71) Applicant: Samsung Electronics Co., Ltd., Suwon-si (KR)

(72) Inventors: Jong Youn Kim, Seoul (KR); Dong Kyu Kim, Anyang-si (KR); Jin-Woo Park, Seoul (KR); Min Jun Bae, Yongin-si (KR); Gwang Jae Jeon, Hwaseong-si (KR)

(73) Assignee: Samsung Electronics Co, Ltd., Gyeonggi-Do (KR)

( * ) Notice: Subject to any disclaimer, the term of this patent is extended or adjusted under 35 U.S.C. 154(b) by 58 days.

(21) Appl. No.: 16/744,623

(22) Filed: Jan. 16, 2020

(65) Prior Publication Data
US 2021/0020608 A1   Jan. 21, 2021

(30) Foreign Application Priority Data
Jul. 15, 2019 (KR) .................. 10-2019-0084858

(51) Int. Cl.
*H01L 25/065* (2006.01)
*H01L 23/31* (2006.01)
*H01L 23/00* (2006.01)
*H01L 23/544* (2006.01)

(52) U.S. Cl.
CPC ...... *H01L 25/0657* (2013.01); *H01L 23/3121* (2013.01); *H01L 23/544* (2013.01); *H01L 24/13* (2013.01); *H01L 2223/54426* (2013.01)

(58) Field of Classification Search
CPC ..... H01L 21/681; H01L 21/68; H01L 23/544; H01L 25/0657
See application file for complete search history.

(56) References Cited

U.S. PATENT DOCUMENTS

| | | | |
|---|---|---|---|
| 8,592,952 B2 | 11/2013 | Jo et al. | |
| 9,343,386 B2 | 5/2016 | Huang et al. | |
| 9,666,522 B2 | 5/2017 | Huang et al. | |
| 9,685,411 B2 | 6/2017 | Chen | |
| 9,773,702 B2 | 9/2017 | Gong et al. | |
| 2008/0170819 A1* | 7/2008 | Kodama | G02B 6/43 385/14 |
| 2010/0210088 A1* | 8/2010 | Ishimaru | H01L 27/14687 438/401 |
| 2014/0374922 A1* | 12/2014 | Huang | H01L 25/105 257/777 |
| 2015/0348904 A1* | 12/2015 | Huang | H01L 23/5389 257/774 |
| 2017/0194221 A1* | 7/2017 | Davis | H01L 22/20 |

(Continued)

*Primary Examiner* — Jaehwan Oh
*Assistant Examiner* — John M Parker
(74) *Attorney, Agent, or Firm* — Harness, Dickey & Pierce, PLC

(57) ABSTRACT

A semiconductor package includes a first semiconductor chip including a first surface and a second surface which face each other, an alignment pattern formed on the first surface, a first redistribution layer arranged on the first surface of the first semiconductor chip, a second redistribution layer arranged on the second surface of the first semiconductor chip, and electrically connected with the semiconductor chip, and a first dielectric layer including the alignment pattern between the first redistribution layer and the semiconductor chip, the alignment pattern overlapping the first surface of the first semiconductor chip.

20 Claims, 13 Drawing Sheets

(56) References Cited

U.S. PATENT DOCUMENTS

2018/0254257 A1   9/2018  Lin et al.
2018/0269167 A1   9/2018  Chen et al.
2021/0391284 A1*  12/2021 Hsu .................... H01L 23/3128

* cited by examiner

SEMICONDUCTOR PACKAGE

This application claims priority from Korean Patent Application No. 10-2019-0084858 filed on Jul. 15, 2019 in the Korean Intellectual Property Office, the disclosure of which is incorporated herein by reference in its entirety.

BACKGROUND

Technical Field

The present disclosure relates to a semiconductor package.

Description of Related Art

Integrated circuits may be fabricated on a single semiconductor wafer. Individual dies which are separated from one another by dicing a semiconductor wafer may be individually packaged. Recently, a semiconductor device is advancing into miniaturization and high performance. In addition, it is desirable to integrate as many components as possible within a given region. Accordingly, sizes of semiconductor packages are gradually reduced.

As a miniaturized packaging method for a semiconductor device, there is wafer level packaging (WLP). The wafer level packaging may normally include a redistribution layer (RDL). The redistribution layer may be used for fan out wiring for a contact pad of an integrated circuit die.

SUMMARY

At least some example embodiments are directed to a semiconductor package with enhanced product reliability.

The technical objectives that are intended to be addressed by the present disclosure are not limited to that mentioned above, and other technical objectives that are not mentioned above can be clearly understood to those skilled in the art based on the description provided below.

According to an example embodiment of the present inventive concepts, there is provided a semiconductor package a first semiconductor chip including a first surface and a second surface facing the first surface including recesses therein; a first redistribution layer on the first surface of the first semiconductor chip; a second redistribution layer on the second surface of the first semiconductor chip, the second redistribution layer configured to electrically connect with the first semiconductor chip; and a first dielectric layer filling the recesses between the first redistribution layer and the first semiconductor chip to form alignment patterns overlapping the first surface of the first semiconductor chip.

According to an example embodiment of the present inventive concepts, there is provided a semiconductor package including a first semiconductor chip; and a second semiconductor chip connected with the first semiconductor chip, the second semiconductor chip including, a body layer including an upper surface and a lower surface facing the upper surface, an active region on the lower surface of the body layer, and alignment patterns including a dielectric material on the upper surface of the body layer.

According to an example embodiment of the present inventive concepts, there is provided a semiconductor package including a plurality of external connection terminals; a plurality of lower electrode pads on the external connection terminals; a first dielectric layer including a first opening configured to expose the lower electrode pads; a first redistribution layer (RDL) on the first dielectric layer, the first RDL configured to electrically connect with the plurality of lower electrode pads; a plurality of post lower pads on the first redistribution layer, the plurality of post lower pads configured to electrically connect with the first redistribution layer; a plurality of posts on the plurality of post lower pads; a first semiconductor chip on the first redistribution layer such that the first semiconductor chip is between the plurality of posts; a mold layer surrounding the plurality of posts and the first semiconductor chip; a second dielectric layer on the plurality of posts, the first semiconductor chip, and the mold layer, the second dielectric layer configured to expose the plurality of posts, the second dielectric layer including alignment patterns protruding inward towards the first semiconductor chip; and a second redistribution layer on the second dielectric layer, the second redistribution layer configured to electrically connect with the plurality of posts.

BRIEF DESCRIPTION OF THE DRAWINGS

The above and other objects, features and advantages of example embodiments will become more apparent to those of ordinary skill in the art by describing in detail to some example embodiments thereof with reference to the accompanying drawings, in which.

DETAILED DESCRIPTION

FIGS. 1 to 6 are views illustrating intermediate stages of a fabrication process of a semiconductor package according to some example embodiments.

Figure 1:
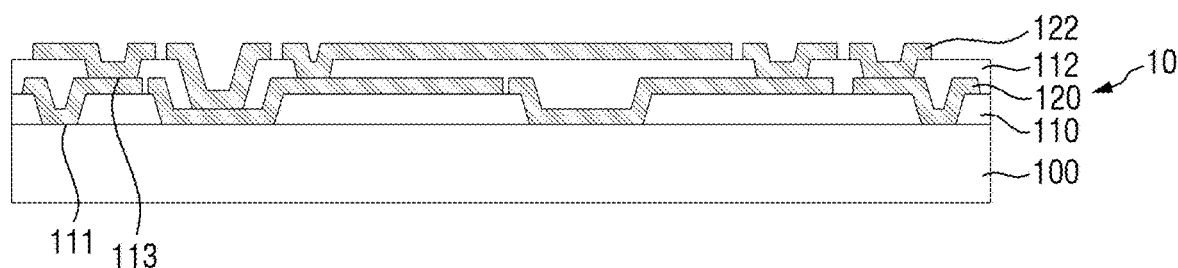
FIGS. 1 to 6 are views illustrating intermediate stages of a fabrication process of a semiconductor package according to some example embodiments.

Referring to FIG. 1, in the intermediate stages of the fabrication process of the semiconductor package according to some example embodiments, a first semiconductor package 10 includes a carrier 100, a first dielectric layer 110 formed on the carrier 100 and including a first opening 111, a first redistribution layer 120 formed on the first dielectric layer 110, a second dielectric layer 112 which exposes at least part of the first redistribution layer 120 on the first redistribution layer 120, and a second redistribution layer formed on the second dielectric layer 112.

The carrier 100 may be a glass carrier, a ceramic carrier, or the like. The carrier 100 may have an upper surface formed in a circular shape, and may have a size of a silicon wafer. For example, the carrier 100 may have a diameter of 8 inches, a diameter of 12 inches, or the like. Although not shown, a release layer may be formed on the carrier. The release layer may be formed with a polymer-based material (for example, a light to heat conversion (LTHC) material) to be removed along with the carrier 100 in a subsequent stage. In some example embodiments, the release layer may be formed with an epoxy-based heat-release material. In some other example embodiments, the release layer may be formed with an ultraviolet (UV) adhesive. The release layer may be sprayed as liquid and may be cured. In some other example embodiments, the release layer may be a laminate film and may be laminated on the carrier 100.

The first dielectric layer 110 may be formed on the carrier 100. In some example embodiments, the first dielectric layer 110 may be formed with polymer, and the polymer may be a photosensitive material which can be easily patterned by using a photolithography process, such as polybenzoxazole (PBO), polyimide, benzocyclobutene (PCB), or the like. In some other example embodiments, the first dielectric layer 110 may be formed with nitride such as silicon nitride, oxide such as silicon oxide, phosphosilicate glass (PSG), borosilicate glass (BSG), boron-doped phosphosilicate glass (BPSG), or the like. Regarding the dielectric layer, the same explanation as described above will be omitted hereinbelow.

The first dielectric layer 110 may include the first opening 111. Through this, a lower electrode pad connecting a plurality of external connection terminals, which will be described below, may be exposed, and may allow electrically connection with the first redistribution layer 120.

The first redistribution layer (redistribution line; RDL) 120 may be formed on the first dielectric layer 110. The first redistribution layer 120 may be electrically connected with an active region in which an element is formed within a first semiconductor chip, which will be described below. The first redistribution layer 120 may be formed by forming a seed layer (not shown) on the first dielectric layer 110, forming a patterned mask on the seed layer, and performing metal plating on an exposed seed layer. The first redistribution layer 120 may be formed to have a shape of the present drawing through the patterned mask and at least part of the seed layer covered by the patterned mask. The seed layer may be formed by using physical vapor deposition (PVD), for example. Plating may be performed by using electroless plating, for example. Regarding the redistribution layer, the same explanation as described above will be omitted hereinbelow.

The first redistribution layer 120 may be conformally formed on the first dielectric layer 110 including the first opening 111. That is, the first redistribution layer 120 may be connected with the plurality of external connection terminals, which will be described below, through the first opening 111, or may be in contact with a plurality of lower electrode pads electrically connected with the plurality of external connection terminals, and may be electrically connected therewith.

The second dielectric layer 112 may include an opening through which at least part of the first redistribution layer 120 is exposed. Through this, an electrical connection with the first redistribution layer 120 is allowed.

The second redistribution layer 122 may be conformally formed on the second dielectric layer 112. That is, the second redistribution layer 122 may be electrically connected with the first redistribution layer 120 through the exposed opening of the second dielectric layer 112.

The semiconductor package according to some example embodiments is not limited hereto, and may include a plurality of redistribution layers and a plurality of dielectric layers, such as third and fourth redistribution layers and third and fourth dielectric layers.

Figure 2:
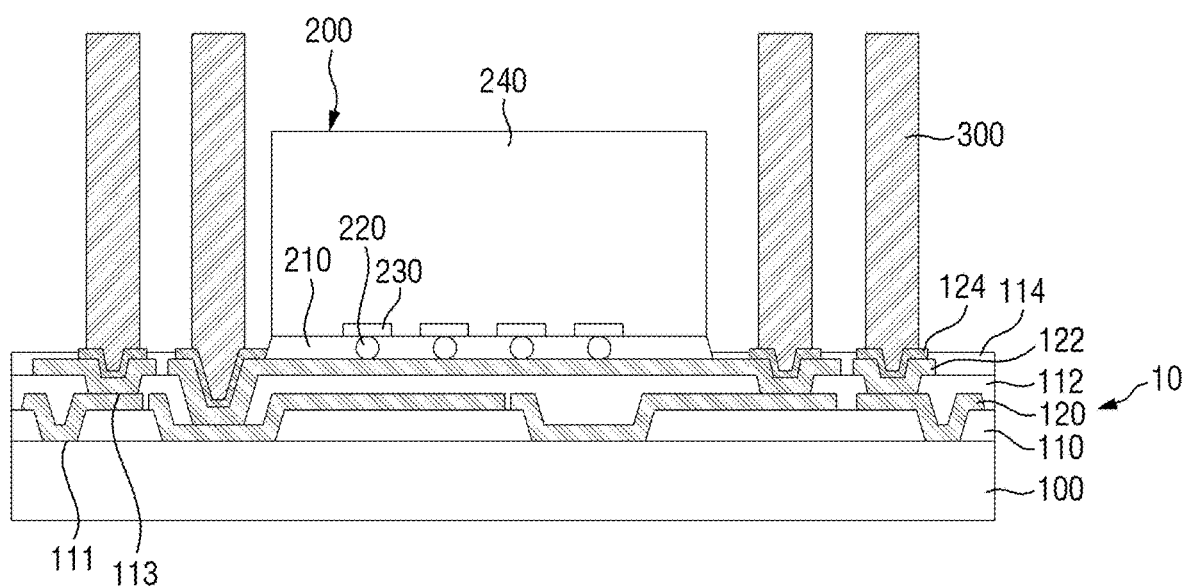

Referring to FIG. 2, a third dielectric layer 114 may be formed on the second redistribution layer 122, a plurality of post lower electrode pads 124 may be formed on the third dielectric layer 114, a plurality of posts 300 may be formed on the plurality of post lower electrode pads 124, and a first semiconductor chip 200 may be formed on the second redistribution layer 122.

The third dielectric layer 114 may expose at least part of the second redistribution layer 122. The third dielectric layer 114 may expose at least part of the second redistribution layer 122, such that the plurality of lower electrode pads are electrically connected with the second redistribution layer 122.

The plurality of post lower electrode pads 124 may be formed on the second redistribution layer 122 exposed by the third dielectric layer 114. The plurality of post lower electrode pads 124 may electrically connect the second redistribution layer 122 and the plurality of posts 300 formed on the plurality of post lower electrode pads 124. The plurality of post lower electrode pads 124 may include a conductive material. For example, the plurality of post lower electrode pads 124 may include gold (Au), silver (Ag), copper (Cu), nickel (Ni), or aluminum (Al). A redundant explanation of the above-described electrode pad will be omitted hereinbelow.

The plurality of posts 300 are formed on the plurality of post lower electrode pads 124. The plurality of posts 300 may be formed by plating. The plurality of posts 300 may be formed by forming a blanket seed layer (not shown) on the plurality of post lower electrode pads 124, and then forming and patterning photoresist (not shown), and may be formed on a seed layer exposed through openings within the photoresist. The photoresist and the seed layer covered by the photoresist may be removed subsequently. The plurality of post lower electrode pads 124 may have a rod shape. Upper surfaces of the plurality of post lower electrode pads 124 may have a circular, rectangular, square, or hexagonal shape, but are not limited hereto.

The plurality of posts 300 may be arranged in rows and columns. The plurality of posts 300 may electrically connect one surface contacting the second redistribution layer 122, and the other surface facing the one surface. The plurality of post lower electrode pads 124 may include gold (Au), silver (Ag), copper (Cu), nickel (Ni), or aluminum (Al). In addition, the plurality of posts 300 may be used as alignment marks.

The first semiconductor chip 200 may be arranged on at least part of the second redistribution layer 122. The first semiconductor chip 200 may be mounted on the second redistribution layer 122 in the form of a flip chip, for example, but is not limited hereto.

The first semiconductor chip 200 includes a body layer 240 which includes an upper surface and a lower surface facing each other, a plurality of sub connection pads 230 included on the lower surface of the body layer 240, a underfill 210 formed on the lower surface of the body layer 240, and a plurality of sub connection terminals 220 formed within the underfill 210. An active region for performing an electric operation may be formed on a lower surface of the first semiconductor chip 200.

The upper surface of the body layer 240 within the first semiconductor chip 200 may be placed on a plane lower than the plurality of posts 300. However, example embodiments are not limited hereto. The first semiconductor chip 200 may be, for example, a logic chip. The first semiconductor chip 200 is not limited hereto, and may include a power management integrated circuit (PMIC) chip.

The plurality of sub connection pads 230 may be arranged within the body layer 240. However, example embodiments are not limited thereto, and all or some of the plurality of sub connection pads 230 may protrude from the body layer 240.

The plurality of sub connection pads 230 may be formed to be spaced apart from one another, and the number of the plurality of sub connection pads 230 is not limited to that in the present drawing. The plurality of sub connection pads 230 may include a conductive material, for example, a metallic material. The plurality of sub connection pads 230 may include, for example, nickel (Ni) and gold (Au). In addition, the plurality of sub connection pads 230 may have different functions.

The plurality of sub connection terminals 220 may be arranged on the plurality of sub connection pads 230. The plurality of sub connection terminals 220 may electrically connect the first semiconductor chip 200 with the second redistribution layer 122. The plurality of sub connection terminals 220 may be, for example, solder balls, solder bumps, or a combination thereof.

The underfill 210 may be formed in an empty space between the plurality of sub connection terminals 220 of the first semiconductor chip 200 arranged on the second redistribution layer 122. A physical shock absorbed by the first semiconductor chip 200 can be reduced through the underfill 210. The underfill 210 may be, for example, an insulating resin, but is not limited hereto. A shape of the underfill 210 is not limited to that in the present drawing.

Figure 3:
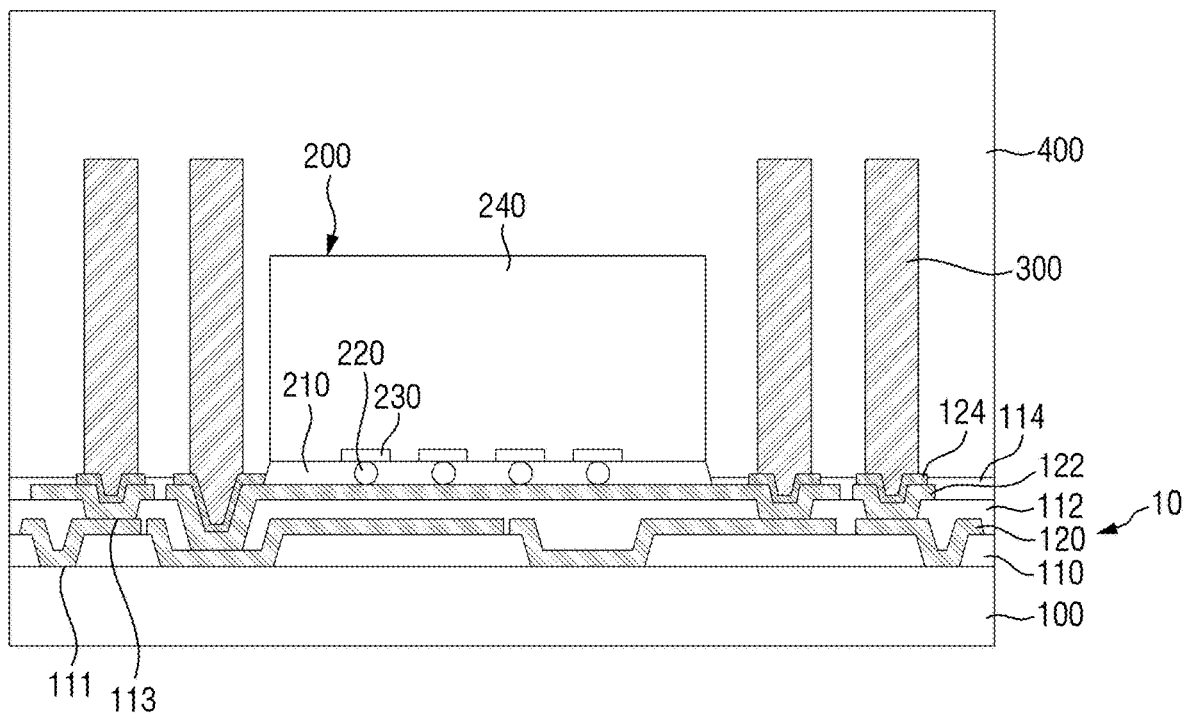

Referring to FIG. 3, a mold layer 400 may be formed on the third dielectric layer 114 and between the first semiconductor chip 200 and the plurality of posts 300. The mold layer 400 in the semiconductor package according to some example embodiments may include an epoxy molding compound.

Figure 4:
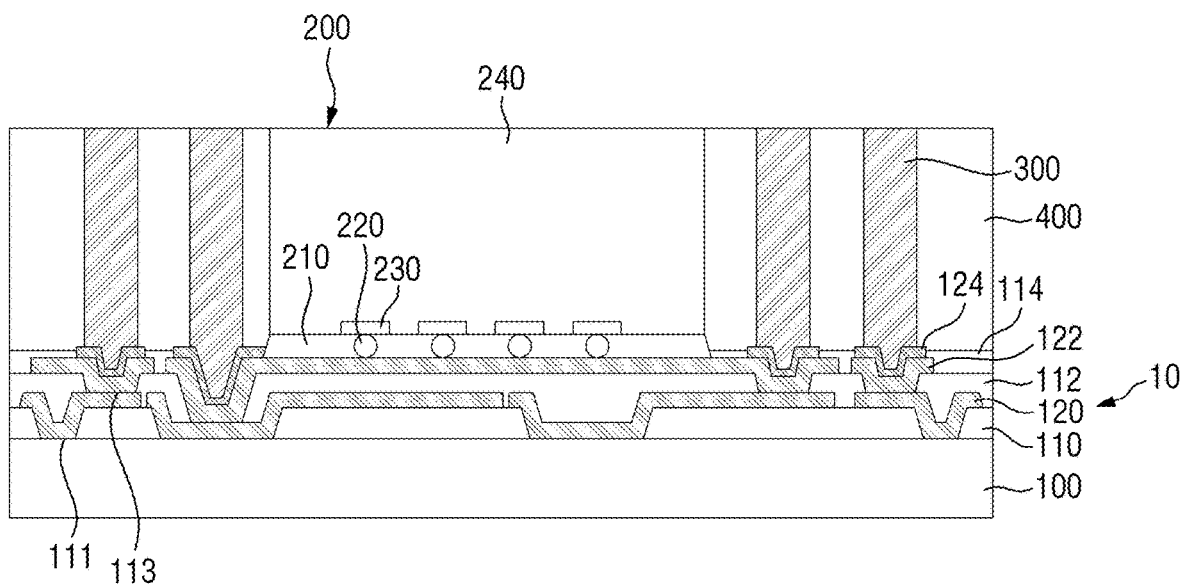

Referring to FIG. 4, the mold layer 400 may be removed until the plurality of posts 300 are exposed, by performing chemical mechanical polishing (CMP) or grinding with respect to the mold layer 400, the upper surface of the body layer 240 of the first semiconductor chip 200, and the plurality of posts 300.

The plurality of posts 300 may be used as alignment marks as described above with reference to FIG. 2. That is, the plurality of posts 300 may be used as a reference for arranging layers to be formed on a surface facing the second redistribution layer 122 (for example, back-side redistribution layers) at desired positions, and for maintaining the intended position and direction of the first semiconductor chip 200.

However, the shape of the plurality of posts 300 may be deformed in the process of performing chemical mechanical polishing or grinding. That is, the plurality of posts 300 deformed by the chemical mechanical polishing or grinding may not perform the role of the alignment marks well.

Accordingly, in one or more example embodiments, alignment patterns to perform the role of additional alignment marks in addition to the plurality of posts 300 are included to increase an accuracy of alignment of layers to be formed on the plurality of posts 300 (for example, back-side redistribution layers). For example, the alignment patterns capable of additionally performing the role of the alignment marks may be formed by generating and filling recesses on the body layer 240 of the first semiconductor chip 200 in case the plurality of posts 300 do not perform the role of the alignment marks due to the chemical mechanical polishing or grinding. Hereinafter, the alignment patterns will be described in detail.

Figure 5:
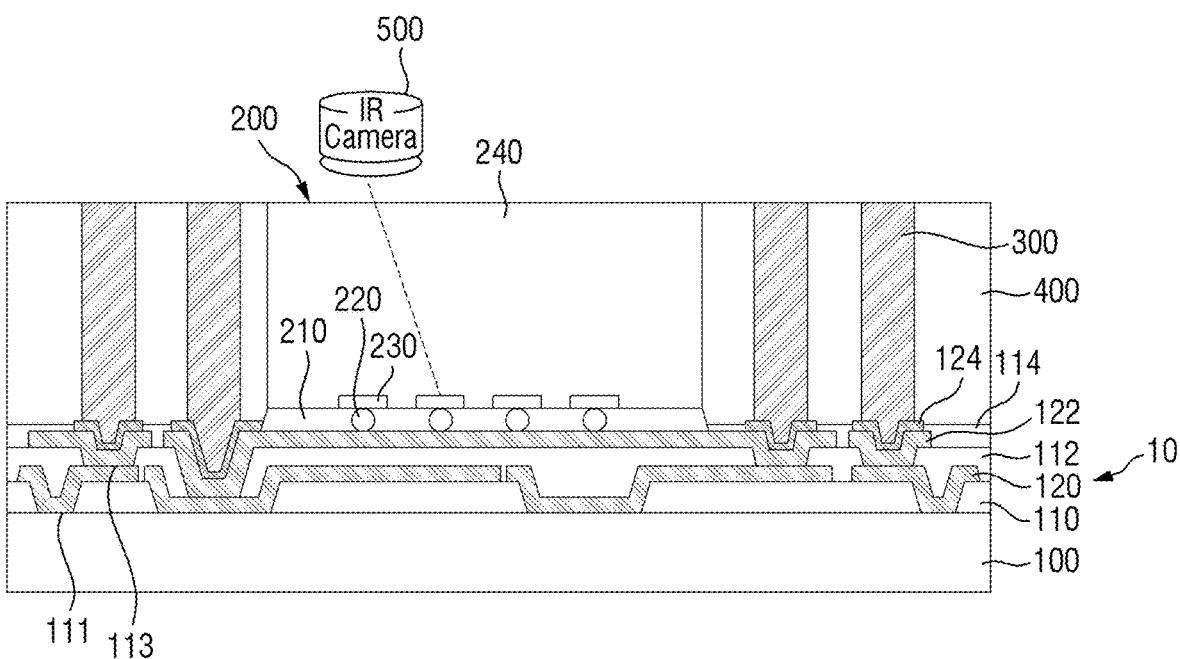
Figure 6:
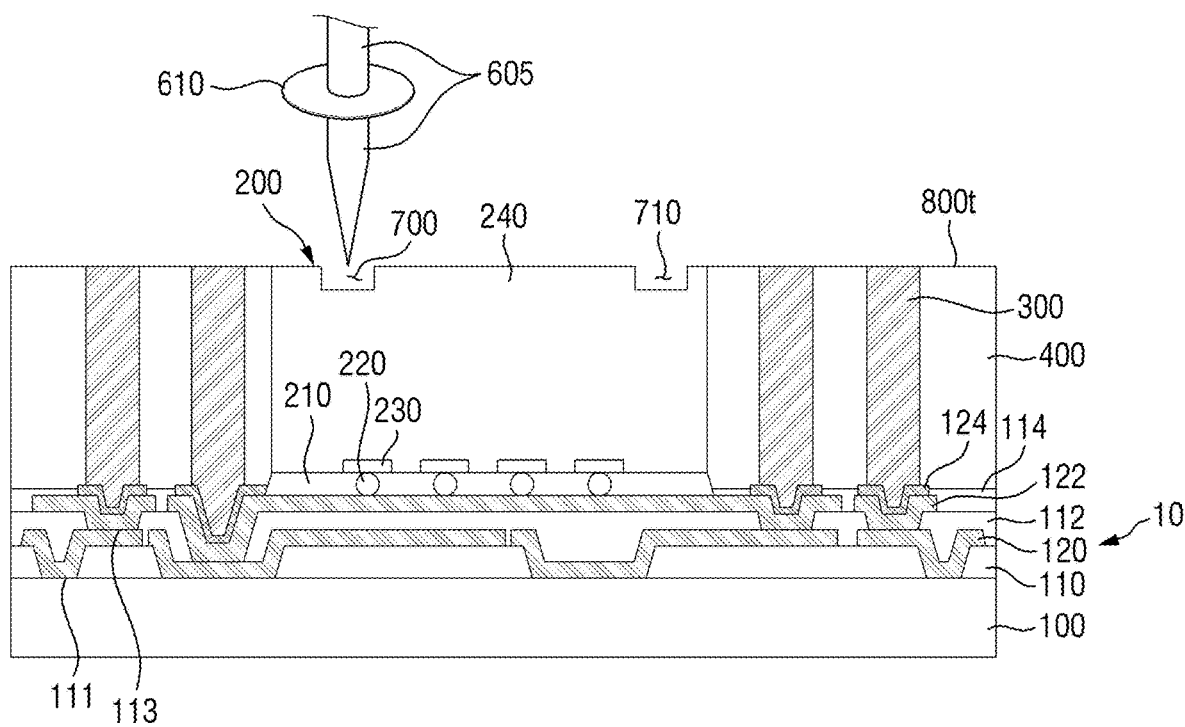

Referring to FIGS. 5 and 6, an infrared camera 500 may be used to form alignment patterns 700 and 710 on the body layer 240 of the first semiconductor chip 200. That is, an arrangement of a surface (for example, the second redistribution layer 122) facing a surface on which the alignment patterns 700 and 710 are formed may be recognized through the infrared camera 500, and the alignment patterns 700 and 710 may be formed.

In the fabrication process of the semiconductor package according to some example embodiments, the alignment patterns 700 and 710 may be formed by recognizing the arrangement of the surface (for example, the second redistribution layer 122) facing the surface on which the alignment patterns 700 and 710 are formed without using the infrared camera 500.

Thereafter, the alignment patterns 700 and 710 may be formed on positions where they can perform the role of the alignment marks of the body layer 240 of the first semiconductor chip 200. In this case, the alignment patterns 700 and 710 may be formed through a laser 605.

Specifically, the laser 605 may be projected onto a condensing lens 610. The alignment patterns 700 and 710 may be formed by accurately projecting the laser 605 onto portion where the alignment patterns 700 and 710 are to be formed on the body layer 240 within the first semiconductor chip 200 through the condensing lens 610. The laser 605 may include a nano (10-9) second pulse laser or pico (10-12) second pulse laser, but example embodiments are not limited hereto.

At least several pico seconds may be required to convert energy of the laser 605 into thermal energy within the body layer 240 of the first semiconductor chip 200. A pulse duration time of the nano second or pico second pulse laser may be spent for several pico seconds or more, and then laser energy may be converted into thermal energy within the body layer 240 of the first semiconductor chip 200.

Hereinafter, the alignment patterns 700 and 710 will be described with reference to FIGS. 7 and 8, which are top views seen from an upper surface 800*t* of the semiconductor package according to some example embodiments.

Figure 7:
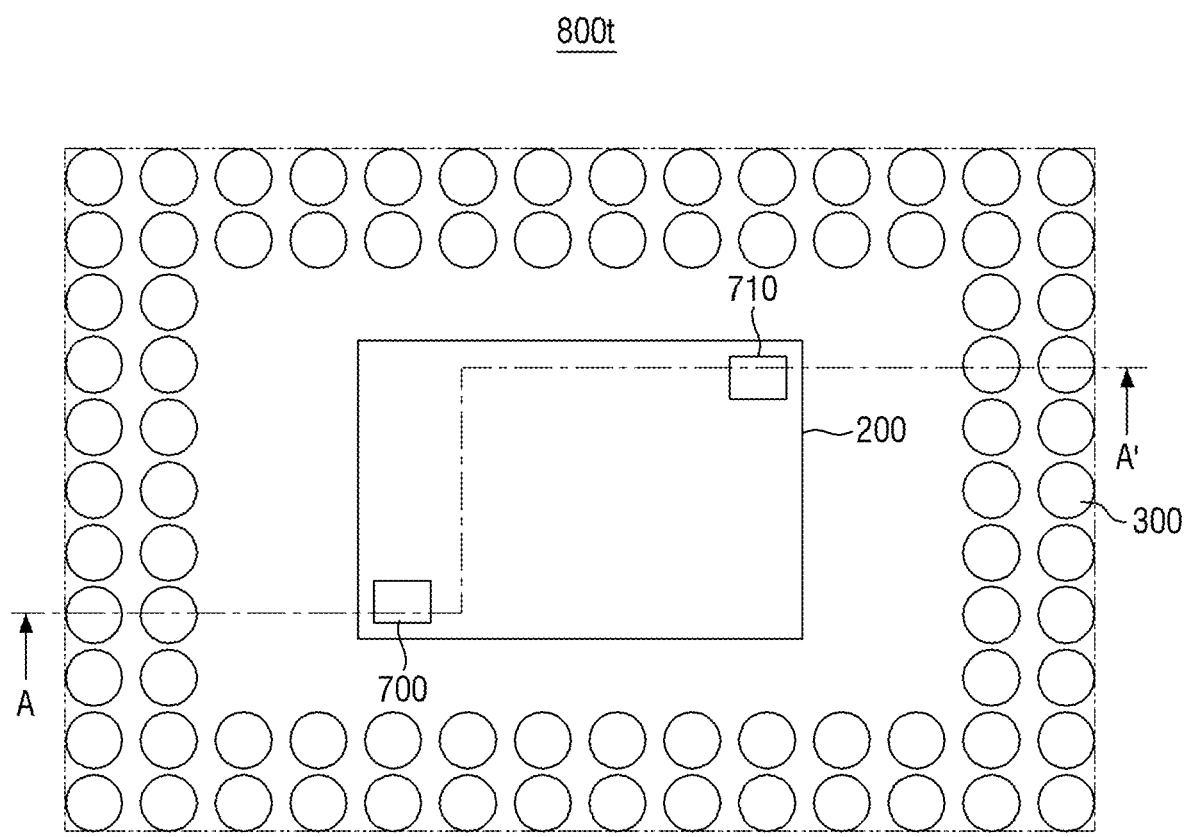
FIGS. 7 and 8 are top views of the semiconductor package of FIG. 6 according to some example embodiments.
Figure 8:
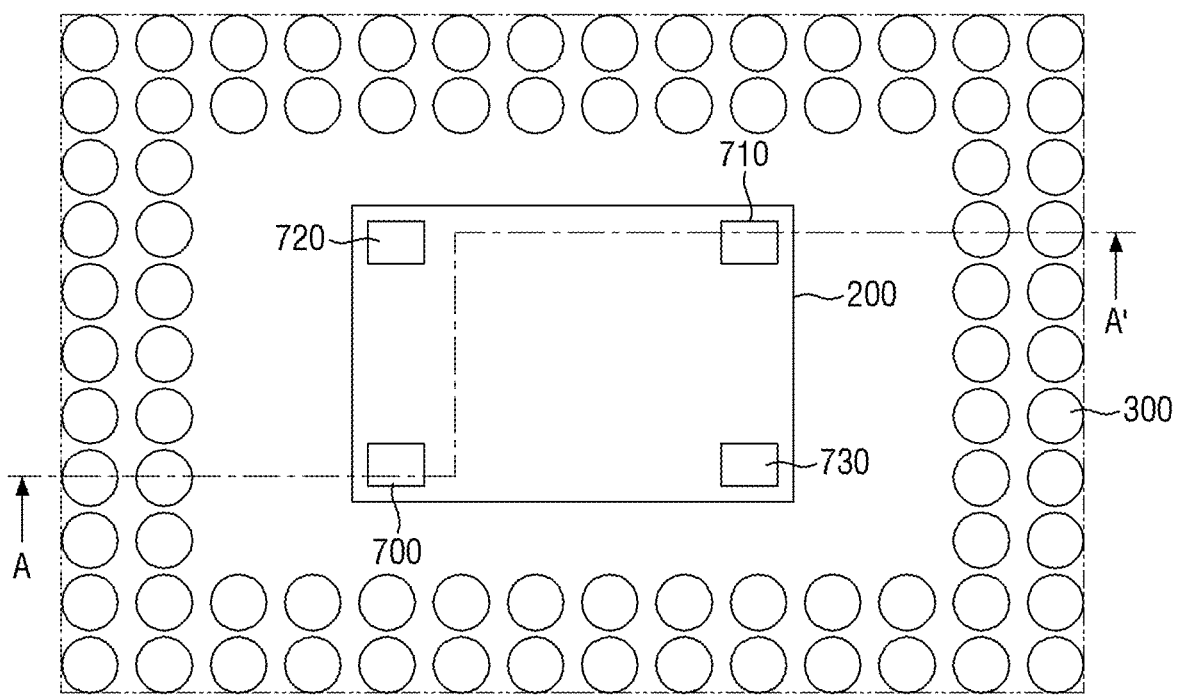

FIGS. 7 and 8 are top views of the semiconductor package of FIG. 6 according to some example embodiments. That is, FIGS. 1 to 6 are cross-sectional views taken on line A-A'.

Referring to FIGS. 6 to 8, the plurality of posts 300 may be arranged in rows and columns with one or more alignment patterns 700, 710, 720 and 730 within the body layer 240.

For example, referring to FIG. 7, two alignment patterns 700 and 710 may be formed within the first semiconductor chip 200 spaced apart from each other in a diagonal direction within the body layer 240. However, the number of the alignment patterns is not limited to the two alignment patterns 700 and 710 and may be adjusted if necessary.

For example, referring to FIG. 8, four alignment patterns 700, 710, 720, and 730 may be formed within the first semiconductor chip 200 (e.g., within the within the body layer 240 of the first semiconductor chip 200).

As the number of the alignment patterns increases, the efficiency of performing the role of the alignment marks can be further enhanced. An example of this will be described through FIG. 9.

Figure 9:
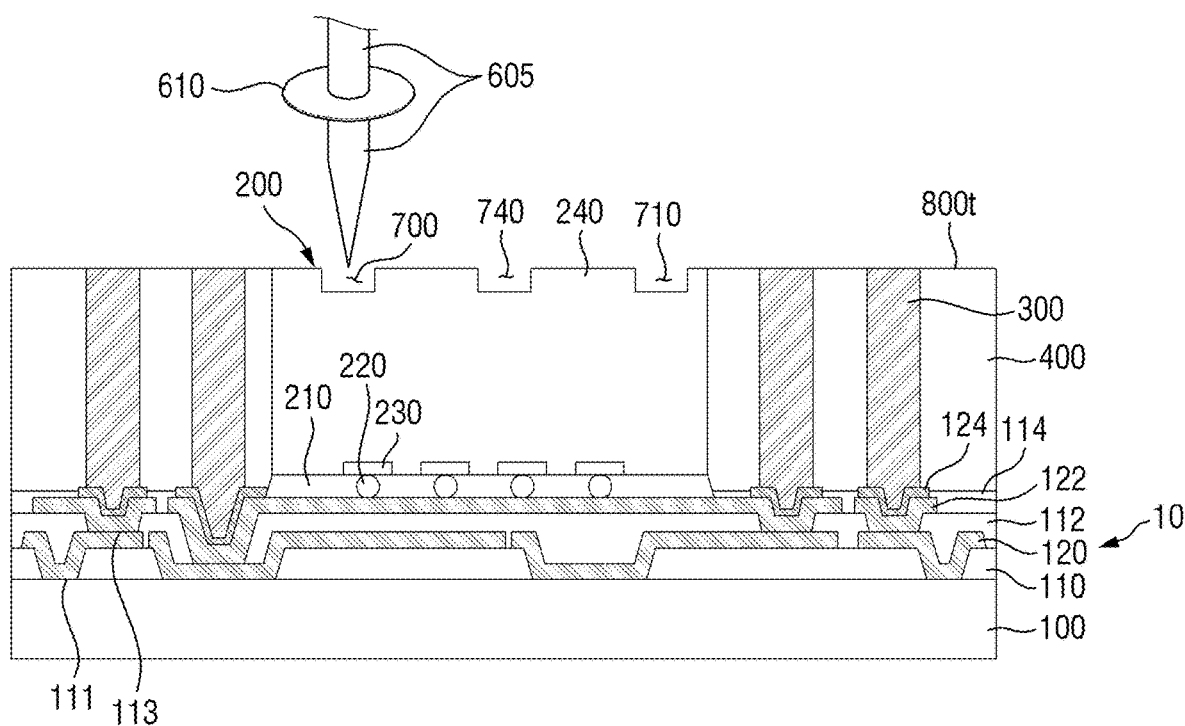
FIG. 9 is a view illustrating intermediate stages of the fabrication process of the semiconductor package according to some example embodiments.
Figure 10:
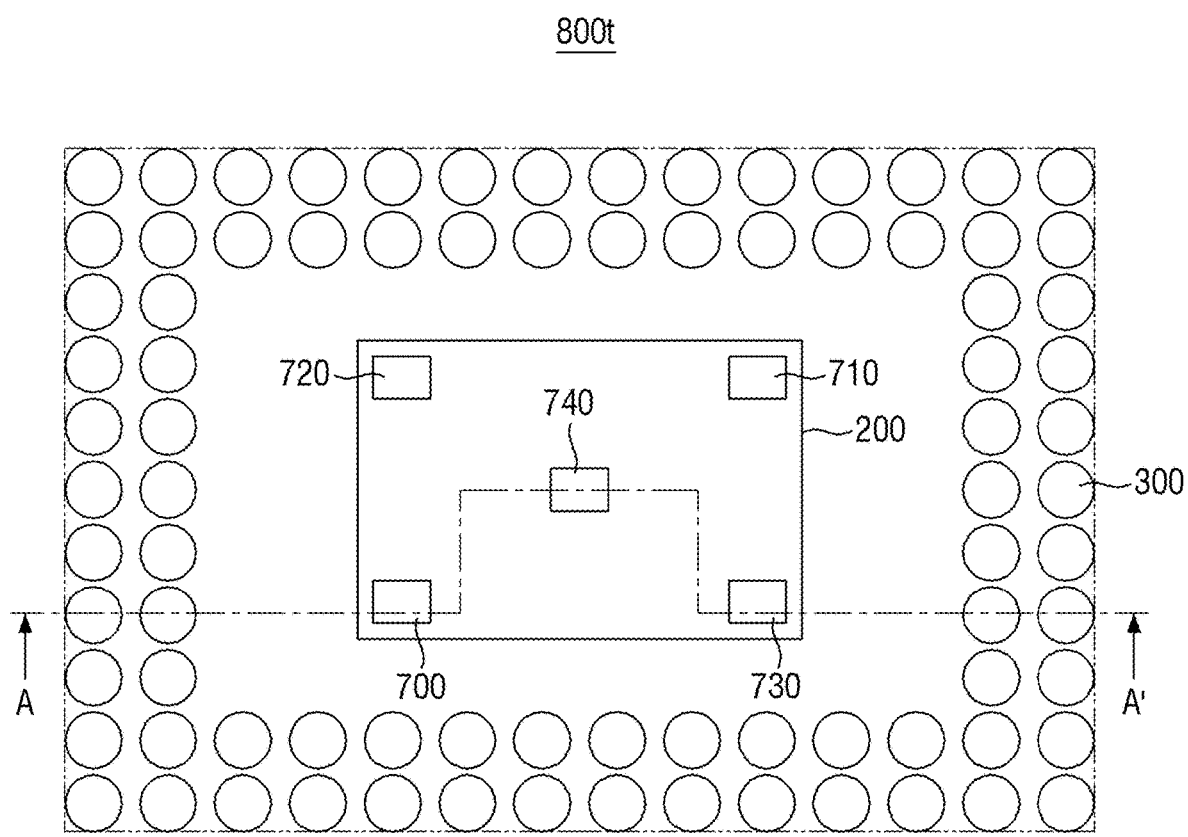
FIG. 10 is a top view of the semiconductor package according to some example embodiments.

FIG. 9 is a view illustrating intermediate stages of the fabrication process of the semiconductor package according to some example embodiments. For reference, the same explanation as in FIG. 6 will be omitted. FIG. 10 is a top view of the semiconductor package according to some example embodiments.

Referring to FIG. 9, an alignment pattern 740 may further be formed through a laser. A top view seen from the upper surface 800*t* will be described with reference to FIG. 10.

Referring to FIG. 10, according to some example embodiments, at least some of the alignment patterns 700, 710, 720, 730, and 740 of the semiconductor package may be positioned at the center within the body layer 240 of the first semiconductor chip 200, while others ones of the alignment patterns 700, 710, 720, 730, and 740 may be positioned at one or more corners of the first semiconductor chip 200 spaced apart from one another in diagonal directions. For example, the alignment pattern 740 may be positioned at the center within the body layer 240 and the alignment patterns 700, 710, 720, and 730 may be positioned as respective corners of the body layer 240. However, the position of the alignment pattern 740 is not limited to the center of the first semiconductor chip 200.

As described above, the alignment patterns capable of performing the role of the alignment marks are formed within the first semiconductor chip 200 in addition to the plurality of posts 300, such that accuracy in the fabrication process of the semiconductor package according to some example embodiments, which will be described below, can be enhanced.

FIGS. 11 to 14 are views illustrating intermediate stages of the fabrication process of the semiconductor package according to some example embodiments.

Figure 11:
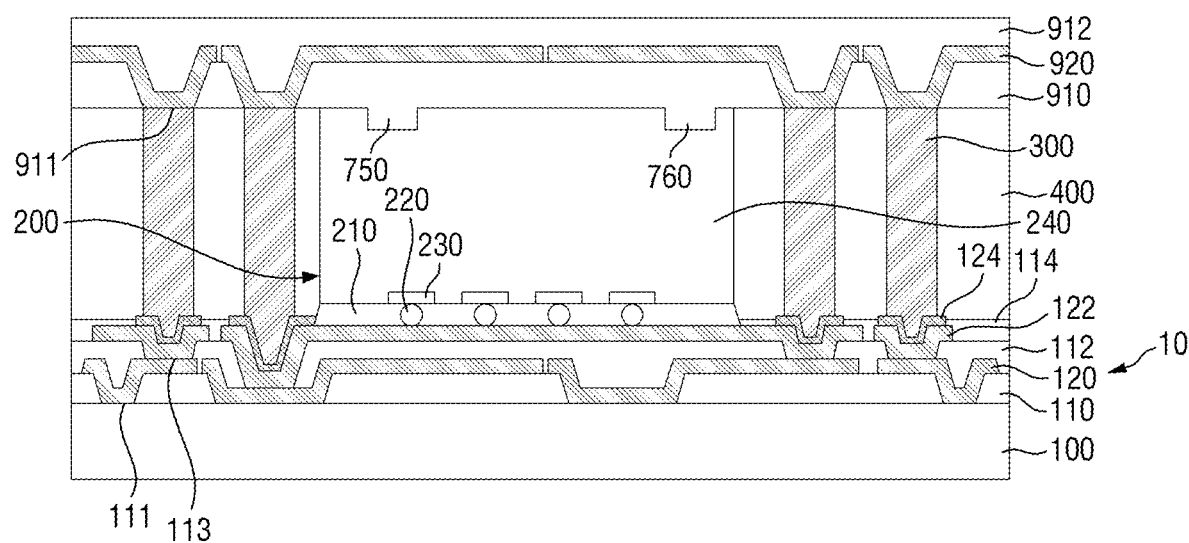
FIGS. 11 to 14 are views illustrating intermediate stages of the fabrication process of the semiconductor package according to some example embodiments.

Referring to FIG. 11, a fourth dielectric layer 910 is formed on the mold layer 400, the plurality of posts 300, and the body layer 240 of the first semiconductor chip 200 to expose the plurality of posts 300. A third redistribution layer 920 is formed on the fourth dielectric layer 910, and a fifth dielectric layer 912 is formed on the third redistribution layer 920.

The alignment patterns described above may indicate a state in which recesses are formed through a laser. Alignment patterns 750 and 760 may be formed with the fourth dielectric layer 910 filling recesses formed by the laser. All of the recesses formed through the laser and the alignment patterns 750 and 760 formed by filling the dielectric layer are configured to perform the role of the alignment marks, and are referred to as the alignment patterns without distinguishing the terms.

The fourth dielectric layer 910 may expose the plurality of posts 300 to assist the third redistribution layer 920 to be electrically connected with the plurality of posts 300. In addition, the fourth dielectric layer 910 may fill the recess formed within the first semiconductor chip 200 through the laser. The alignment patterns 750 and 760 may be formed with the fourth dielectric layer 910 filling.

The third redistribution layer 920 may be formed on the fourth dielectric layer 910 to be electrically connected with the plurality of posts 300.

The fifth dielectric layer 912 may be formed on the third redistribution layer 920 to expose the third redistribution layer 920 to allow a plurality of external connection terminals, which will be formed later, to be electrically connected with the third redistribution layer 920.

Figure 12:
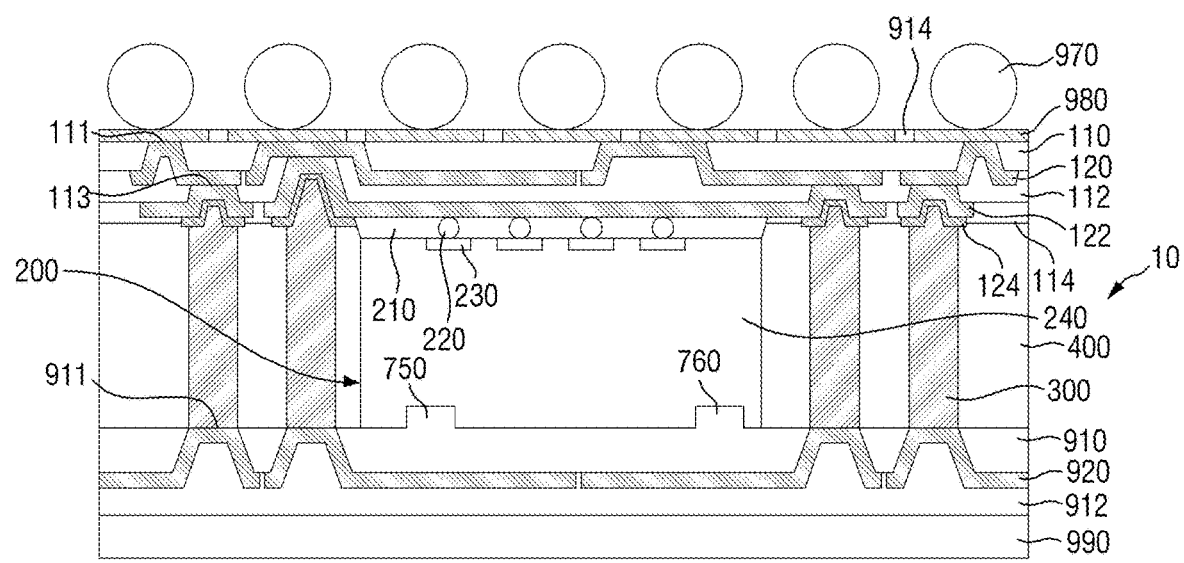

Referring to FIG. 12, after the carrier 100 of FIG. 1 is removed, a plurality of lower electrode pads 980 and a sixth dielectric layer 914 may be formed on the first redistribution layer 120 and the first dielectric layer 110. A plurality of external connection terminals 970 may be formed on the plurality of lower electrode pads 980.

The plurality of lower electrode pads 980 may assist the plurality of external connection terminals 970 to be electrically connected with the first redistribution layer 120.

The plurality of external connection terminals 970 may be electrically connected with an outside. For example, the plurality of external connection terminals 970 may electrically connect the first semiconductor package 10 to another semiconductor package, for example. Alternatively, the plurality of external connection terminals 970 may electrically connect the first semiconductor package 10 to another semiconductor device, for example.

Although the plurality of external connection terminals 970 are solder balls in the drawings which will be described below, this should not be considered as limiting. For example, the plurality of external connection terminals 970 may be solder bumps, grid arrays, or conductive tabs. The number of the plurality of external connection terminals 970 is not limited hereto.

Figure 13:
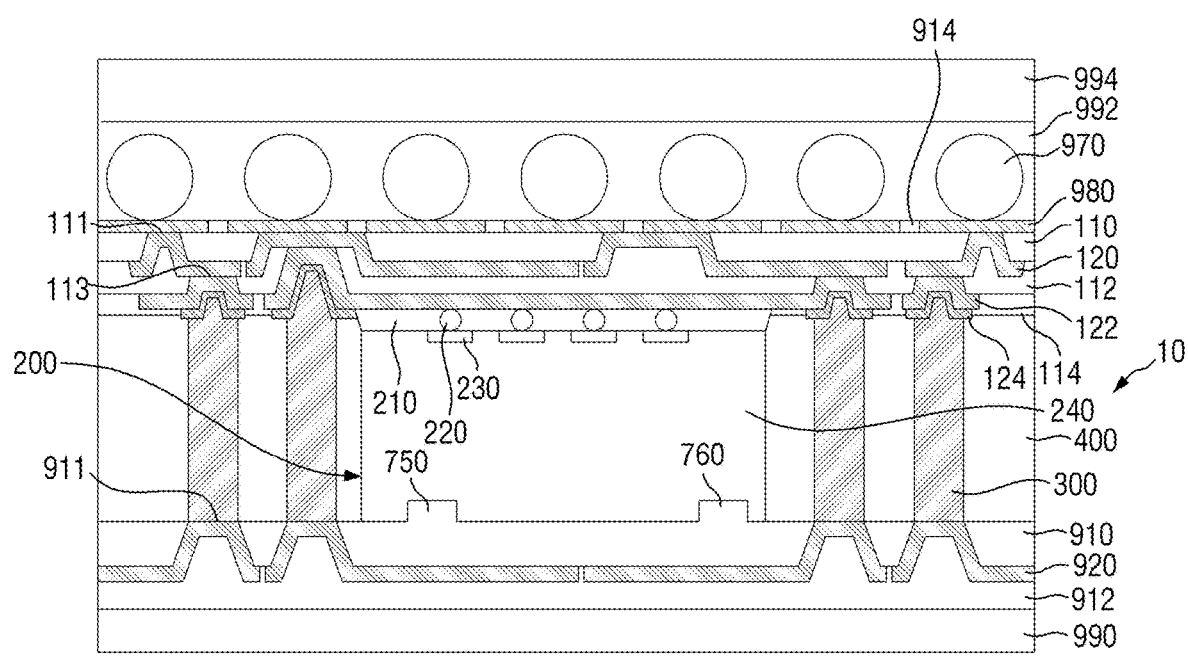

Referring to FIG. 13, an adhesive layer 992 may be formed on the plurality of external connection terminals 970, and then a post carrier 100 may be formed on the adhesive layer 992. The adhesive layer 992 may be formed with a polymer-based material (for example, light to heat conversion (LTHC)) to be removed along with the post carrier 100. In some example embodiments, the adhesive layer 992 may be formed with an epoxy-based heat-release material. In some other example embodiments, the adhesive layer 992 may be formed with an ultraviolet (UV) adhesive.

Figure 14:
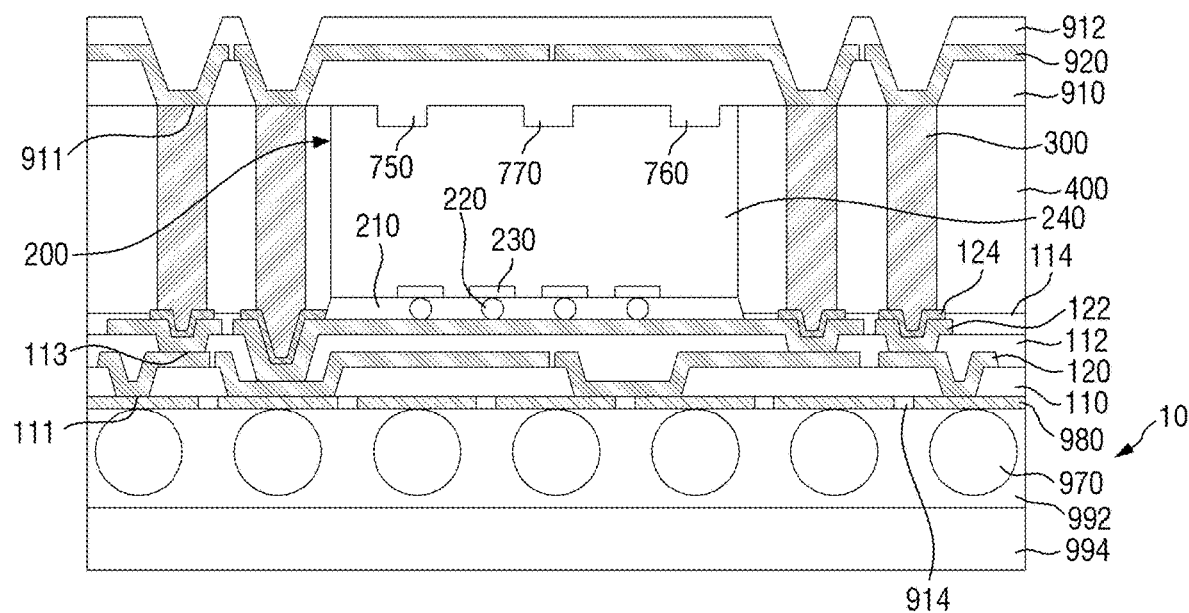

Referring to FIG. 14, the third redistribution layer 920 may be exposed by etching the fifth dielectric layer 912. Through this, the first semiconductor package 10 may be electrically connected with a second semiconductor package 1000.

Figure 15:
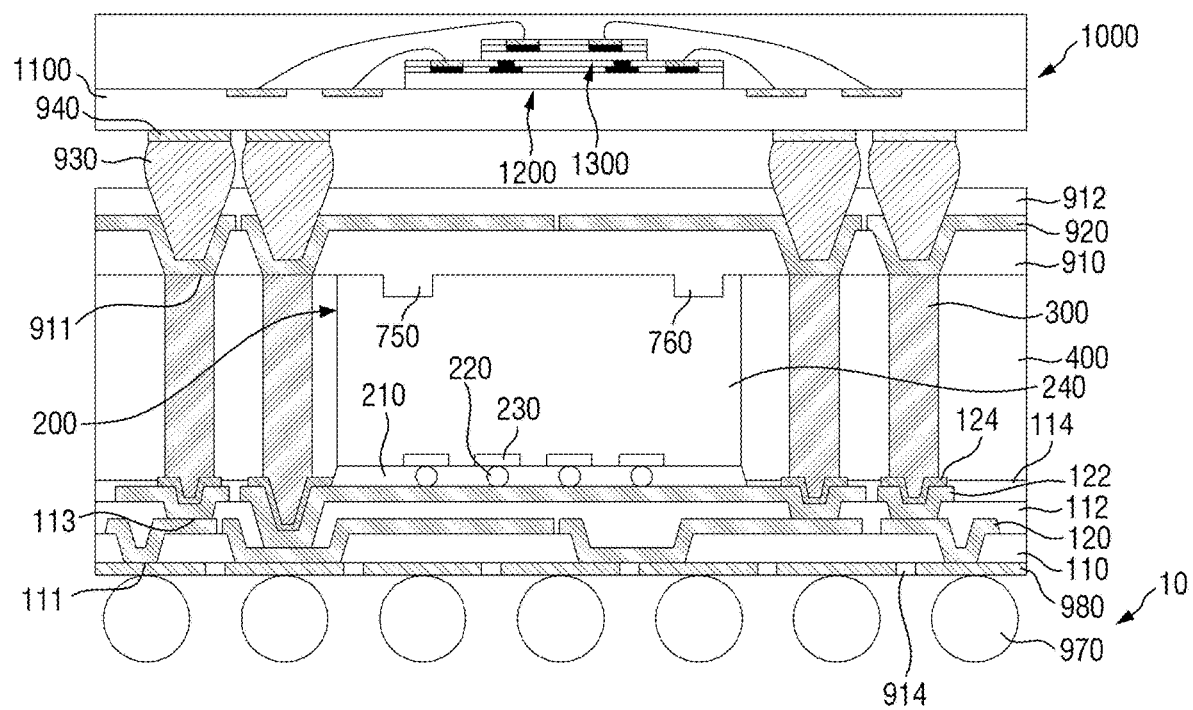
FIGS. 15 and 16 are views illustrating the semiconductor package according to some example embodiments.
Figure 16:
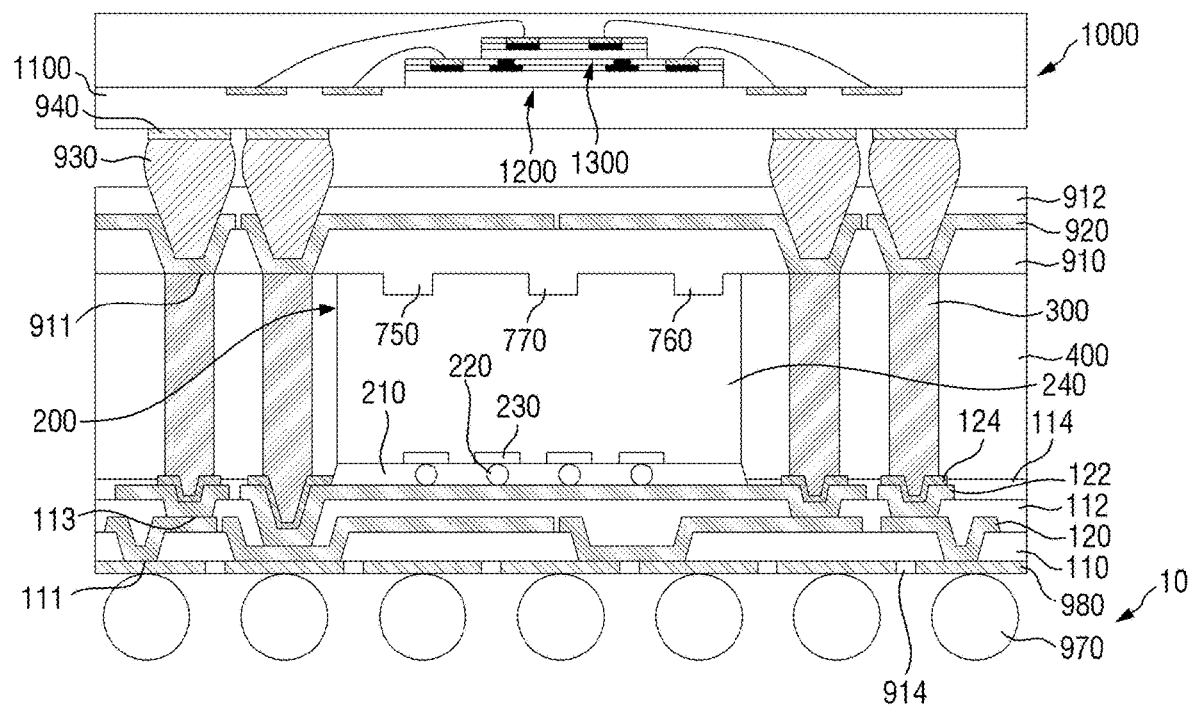

FIGS. 15 and 16 are views illustrating the semiconductor package according to some example embodiments.

Referring to FIG. 15, the second semiconductor package 1000 may be arranged on the first semiconductor package 10.

More specifically, a plurality of connection terminals 930 may be formed on the sixth dielectric layer 914 which exposes the third redistribution layer 920, and a plurality of upper pads 940 may be formed on the plurality of connection terminals 930. A package substrate 1100 of the second semiconductor package 1000 may be arranged on the plurality of upper pads 940. That is, the first semiconductor package 10 and the second semiconductor package 1000 may be electrically connected with each other.

The alignment patterns 750 and 760 may be electrically insulated between the first semiconductor package 10 and the second semiconductor package 1000.

The second semiconductor package 1000 may include a second semiconductor chip 1200 and a third semiconductor chip 1300 on the second semiconductor chip 1200, but the number of semiconductor chips is not limited hereto and may be increased or reduced if necessary.

The first semiconductor chip 200 and/or the second semiconductor chip 1200 may be a NAND flash chip, a dynamic random access memory (DRAM), a flash memory chip, or a resistance changeable memory chip.

Referring to FIG. 16, in some example embodiments, the alignment patterns may include three alignment patterns 750, 760 and 770 electrically insulated between the first semiconductor package 10 and the second semiconductor package 1000. In FIG. 16, only the number and patterns of the alignment patterns 750, 770, and 760 are different from those of FIG. 15, and thus a redundant explanation is omitted.

Example embodiments of the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concept or essential characteristics of the present disclosure.

Accordingly, it will be understood that the example embodiments described above are only illustrative, and should not be construed as limiting.

What is claimed is:

1. A semiconductor package comprising:
 a first semiconductor chip including a first surface and a second surface facing the first surface, the first surface including recesses therein;
 a first redistribution layer on the first surface of the first semiconductor chip;
 a second redistribution layer on the second surface of the first semiconductor chip, the second redistribution layer configured to electrically connect with the first semiconductor chip;
 a plurality of posts on the second redistribution layer in proximity of the first semiconductor chip and extending to a same height as the first surface of the first semiconductor chip to form alignment patterns; and
 a first dielectric layer filling the recesses between the first redistribution layer and the first semiconductor chip to form additional alignment patterns on the first surface of the first semiconductor chip.

2. The semiconductor package of claim 1, wherein the first dielectric layer comprises at least two additional alignment patterns.

3. The semiconductor package of claim 2, wherein the first semiconductor chip comprises:
 a body layer, the body layer including the recesses with the additional alignment patterns formed therein such that the additional alignment patterns are spaced apart from each other in a diagonal direction of the body layer.

4. The semiconductor package of claim 3, wherein at least one of the additional alignment patterns is at a center of the body layer.

5. The semiconductor package of claim 1, further comprising:
 a second dielectric layer on the second redistribution layer, the second dielectric layer including a first opening configured to expose at least part of the second redistribution layer; and
 a third redistribution layer formed on the second dielectric layer, the third redistribution layer configured to electrically connect with the first semiconductor chip.

6. The semiconductor package of claim 5, further comprising:
 a third dielectric layer on the first redistribution layer;
 a plurality of connection terminals configured to electrically connect with the first redistribution layer through the third dielectric layer;
 a plurality of upper pads on the plurality of connection terminals;
 a package substrate on the upper pads; and
 a second semiconductor chip on the package substrate.

7. The semiconductor package of claim 1, wherein the first semiconductor chip comprises:
 a plurality of sub connection terminals configured to electrically connect with the second redistribution layer;
 a body layer including the second surface; and
 a plurality of sub connection pads in the body layer such that the plurality of sub connection pads are aligned with the plurality of sub connection terminals.

8. The semiconductor package of claim 7, wherein the plurality of sub connection terminals comprise bumps.

9. The semiconductor package of claim 8, wherein the additional alignment patterns comprise:
 at least two additional alignment patterns.

10. The semiconductor package of claim 1, further comprising:
 a plurality of posts on the second redistribution layer in proximity of the first semiconductor chip.

11. The semiconductor package of claim 10, further comprising:
 a mold layer between the first redistribution layer and the second redistribution layer such that the mold layer surrounds the first semiconductor chip and the plurality of posts.

12. A semiconductor package comprising:
 a first semiconductor chip; and
 a second semiconductor chip connected with the first semiconductor chip, the second semiconductor chip including,
  a body layer including an upper surface and a lower surface facing the upper surface,
  an active region on the lower surface of the body layer,
  a first redistribution layer configured to expose at least part of the active region on the lower surface of the second semiconductor chip,
  a first dielectric layer formed on the first redistribution layer, the first dielectric layer including a first opening configured to expose at least part of the first redistribution layer, and
  alignment patterns including a dielectric material within recesses on the upper surface of the body layer.

13. The semiconductor package of claim 12, wherein the alignment patterns comprise:
 at least two alignment patterns.

14. The semiconductor package of claim 13, wherein the alignment patterns are within recesses adjacent to corners of the body layer, and are spaced apart from each other in a diagonal direction of the body layer.

15. The semiconductor package of claim 14, wherein at least one of the alignment patterns is positioned at a center of the body layer.

16. The semiconductor package of claim 12, further comprising:
 a second redistribution layer on the first redistribution layer and the first dielectric layer.

17. The semiconductor package of claim 16, wherein the second semiconductor chip comprises:
 a plurality of sub connection terminals configured to electrically connect with the first redistribution layer; and
 a plurality of sub connection pads in the body layer such that the plurality of sub connection pads are aligned with the plurality of sub connection terminals.

18. A semiconductor package comprising:
 a plurality of external connection terminals;
 a plurality of lower electrode pads on the external connection terminals;
 a first dielectric layer including a first opening configured to expose the lower electrode pads;
 a first redistribution layer (RDL) on the first dielectric layer, the first RDL configured to electrically connect with the plurality of lower electrode pads;
 a plurality of post lower pads on the first redistribution layer, the plurality of post lower pads configured to electrically connect with the first redistribution layer;
 a plurality of posts on the plurality of post lower pads;
 a first semiconductor chip on the first redistribution layer such that the first semiconductor chip is between the plurality of posts;

a mold layer surrounding the plurality of posts and the first semiconductor chip;

a second dielectric layer on the plurality of posts, the first semiconductor chip, and the mold layer, the second dielectric layer configured to expose the plurality of posts, the second dielectric layer including alignment patterns within recesses on a surface of the first semiconductor chip such that the alignment patterns protrude inward towards the first semiconductor chip; and a second redistribution layer on the second dielectric layer, the second redistribution layer configured to electrically connect with the plurality of posts.

19. The semiconductor package of claim 18, wherein the alignment patterns comprise:

at least two alignment patterns in the second dielectric layer protruding inward towards the first semiconductor chip.

20. The semiconductor package of claim 18, wherein at least one of the alignment patterns is at a center of the first semiconductor chip.

* * * * *